United States Patent
Tang et al.

(10) Patent No.: US 8,735,902 B2
(45) Date of Patent: May 27, 2014

(54) MEMORIES WITH MEMORY ARRAYS EXTENDING IN OPPOSITE DIRECTIONS FROM A SEMICONDUCTOR AND THEIR FORMATION

(75) Inventors: Sanh D. Tang, Boise, ID (US); John Zahurak, Eagle, ID (US); Siddartha Kondoju, Boise, ID (US); Haitao Liu, Meridian, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 351 days.

(21) Appl. No.: 12/776,965

(22) Filed: May 10, 2010

(65) Prior Publication Data

US 2011/0272754 A1 Nov. 10, 2011

(51) Int. Cl.
*H01L 21/8239* (2006.01)

(52) U.S. Cl.
USPC .................. 257/74; 257/278; 257/E21.614

(58) Field of Classification Search
USPC ................. 257/74, 278, E21.614, 314
See application file for complete search history.

(56) References Cited

U.S. PATENT DOCUMENTS

| 7,112,815 | B2 | 9/2006 | Prall |
| 2002/0070403 | A1* | 6/2002 | Hsu et al. .................. 257/302 |
| 2006/0146608 | A1 | 7/2006 | Pasoli et al. |
| 2007/0023805 | A1 | 2/2007 | Wells et al. |
| 2008/0151631 | A1* | 6/2008 | Hyun et al. .............. 365/185.18 |
| 2009/0230454 | A1 | 9/2009 | Pekny |
| 2009/0303795 | A1 | 12/2009 | Morton et al. |
| 2010/0155803 | A1 | 6/2010 | Sandhu |
| 2010/0187660 | A1 | 7/2010 | Tang |
| 2010/0213527 | A1* | 8/2010 | Shim et al. .................. 257/314 |
| 2010/0213578 | A1 | 8/2010 | Sandhu |

OTHER PUBLICATIONS

Tang, et al., *Semiconductor-Metal-On-Insulator Structures, Methods of Forming such structures, and semiconductor devices including such structures*, U.S. Appl. No. 12/715,704, filed Mar. 2, 2010.
Tang, et al. *Semiconductor devices indluding a diode structure over a conductive strap and methods of forming such semiconductor devices*, U.S. Appl. No. 12/715,743, filed Mar. 2, 2010.
Tang, et al., *Floating body cell structures, devices including same, and methods for forming same*, U.S. Appl. No. 12/715,843, filed Mar. 2, 2010.
Tang, et al. *Semiconductor cells, arrays, devices and systems having a buried conductive line and methods for forming the same*, U.S. Appl. No. 12/715,922, filed Mar. 2, 2010.

(Continued)

*Primary Examiner* — Fernando L Toledo
*Assistant Examiner* — Peter Bradford
(74) *Attorney, Agent, or Firm* — Dicke, Billig & Czaja, PLLC

(57) ABSTRACT

Memories and their formation are disclosed. One such memory has a first array of first memory cells extending in a first direction from a first surface of a semiconductor. A second array of second memory cells extends in a second direction, opposite to the first direction, from a second surface of the semiconductor. Both arrays may be non-volatile memory arrays. For example, one of the memory arrays may be a NAND flash memory array, while the other may be a one-time-programmable memory array.

12 Claims, 11 Drawing Sheets

(56) References Cited

OTHER PUBLICATIONS

Tang, et al., *Thyristor-Based Memory Cells, Devices and Systems Including the Same and Methods for Forming the Same*, U.S. Appl. No. 12/715,889, filed Mar. 2, 2010.

"Three Dimensionally Stacked NAND Flash Memory Technology Using Stacking Single Crystal Si Layers on ILD and TANOS Structure for Beyond 30 nm Node," Soon-Moon Jung, et al., *Samsung Electronics*, date unknown, 3 pages.

"DG-TFT-SONOS 3-D Flash," Andrew J. Walker, *Schiltron Corporation* IEDM 2008 (31 sheets).

* cited by examiner

US 8,735,902 B2

MEMORIES WITH MEMORY ARRAYS EXTENDING IN OPPOSITE DIRECTIONS FROM A SEMICONDUCTOR AND THEIR FORMATION

FIELD

The present disclosure relates generally to memories, and, in particular, the present disclosure relates to stacked memory arrays and their formation.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge storage nodes (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line.

A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

In order for memory manufacturers to remain competitive, memory designers are constantly trying to increase the density of memory devices. Increasing the density of a flash memory device generally requires reducing spacing between memory cells and/or making memory cells smaller. Smaller dimensions of some device elements may cause operational problems with the cell. For example, the channel between the source/drain regions becomes shorter, possibly causing severe short channel effects.

One way of increasing the density of memory devices is to form stacked memory arrays, e.g., often referred to as three-dimensional memory arrays. For example, one type of three-dimensional memory array includes a plurality of traditional "two-dimensional" arrays, such as NAND memory arrays, stacked vertically one atop the other, with the memory cells of each memory array being silicon-on-sapphire transistors, silicon-on-insulator transistors, thin film transistors, thermoelectric polymer transistors, semiconductor-oxide-nitride-oxide-semiconductor transistors, etc. Another type of three-dimensional memory array includes pillars of stacked memory elements, such as vertical NAND strings.

For the reasons stated above, and for other reasons stated below which will become apparent to those skilled in the art upon reading and understanding the present specification, there is a need in the art for alternative stacked (e.g., three-dimensional) memory arrays.

DETAILED DESCRIPTION

Figure 1:
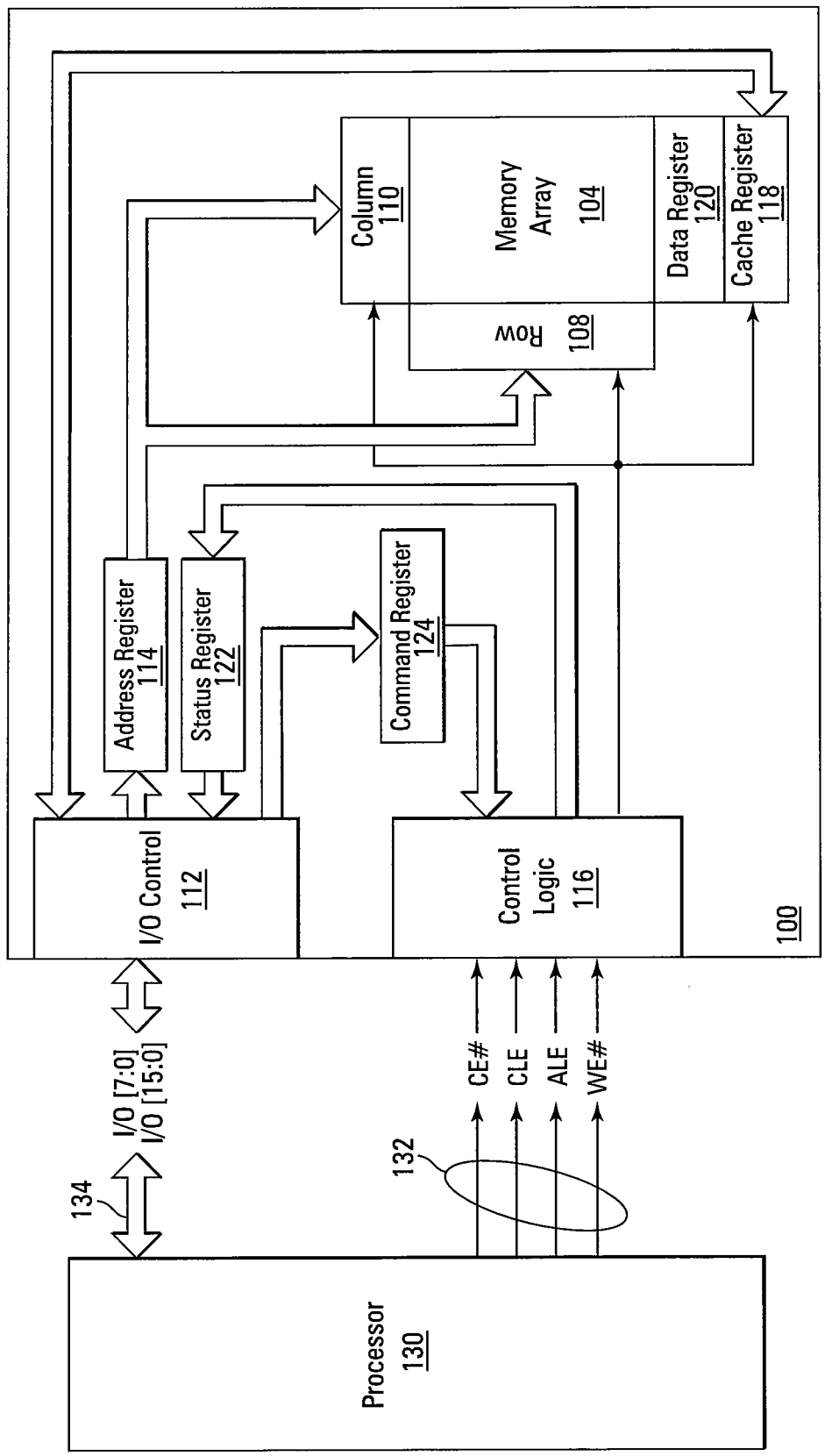
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof.

In the present disclosure, the term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The following detailed description is, therefore, not to be taken in a limiting sense, and the scope of the present disclosure is defined only by the appended claims and equivalents thereof.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104, according to embodiments of the disclosure. For example, memory array 104 may be a stacked (e.g., three-dimensional) memory array, e.g., having two "two-dimensional" (e.g., quasi-two-dimensional) non-volatile memory arrays, such as NAND arrays, phase-change memory, resistive RAM, etc. at different vertical levels, formed in accordance with disclosed embodiments. For other embodiments, a stacked array may be a hybrid array, where a two-dimensional NAND memory array is formed at one level and a two-dimensional one-time-programmable memory is formed at another level. Such stacked memory arrays may be referred to as multi-level memory arrays.

A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114.

The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
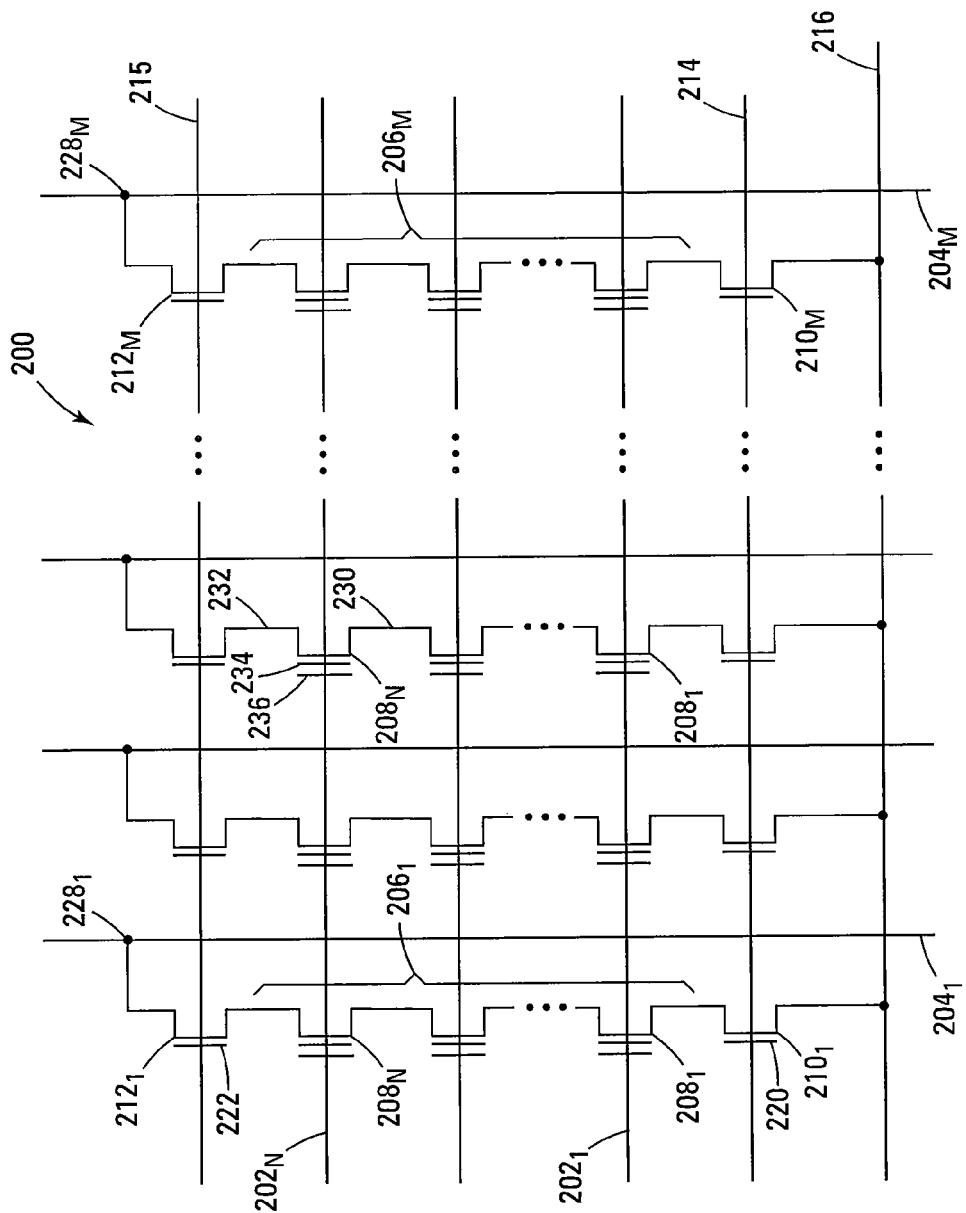
FIG. 2 is a schematic of a NAND memory array, according to another embodiment.

FIG. 2 is a schematic of a quasi-two-dimensional (e.g., "two-dimensional") non-volatile NAND flash memory array 200, e.g., as a portion of memory array 104 in accordance with another embodiment. For example, a NAND memory array 200 may be formed at different levels, e.g., vertical levels, of a stacked memory (e.g., multi-level) array, such as part of a monolithic chip. For example, a NAND memory array 200 may be formed over (e.g., on) each of opposing surfaces of a semiconductor so the respective NAND memory arrays 200 extend from their respective surfaces in opposite directions.

For other embodiments, a NAND memory array 200 may form a portion of a hybrid stacked memory array, e.g., having two-dimensional NAND memory array 200 at one vertical level and a two-dimensional one-time-programmable memory at another level. For example, a NAND memory array 200 may be formed over (e.g., on) a surface of a semiconductor, and a one-time-programmable memory may be formed over (e.g., on) an opposing surface of the semiconductor so that the NAND memory array 200 and the one-time-programmable memory extend from their respective surfaces in opposite directions.

Memory array 200 includes access lines, such as word lines $202_1$ to $202_N$, and intersecting local data lines, such as local bit lines $204_1$ to $204_M$. For some embodiments, where two NAND memory arrays 200 are formed at different levels of a stacked memory array, only one set of local bit lines $204_1$ to $204_M$ might be used for both NAND memory arrays 200. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 is organized in rows (each corresponding to a word line 202) and columns. Each column includes a string, such as NAND strings $206_1$ to $206_M$. Each NAND string 206 is coupled to a common source line 216 and includes memory cells $208_1$ to $208_N$ each located at an intersection of a word line 202 and a local bit line 204. The memory cells 208 of each NAND string 206 are connected in series, source to drain, between a source select line 214 and a drain select line 215. For some embodiments, where two NAND memory arrays 200 are formed at different levels of a stacked memory array, common source line 216 might be used for both NAND memory arrays 200. The memory cells 208 represent non-volatile memory cells for storage of data. For some embodiments, each of memory cells 208 may be a single-level cell programmable to store a single bit or a multi-level cell programmable to store multiple bits.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212.

A source of each source select gate 210 is connected to common source line 216, and thus each source select gate 210 selectively couples its respective NAND string 206 to common source line 216. The drain of each source select gate 210 is connected to the source of the memory cell 208 of the corresponding NAND string 206. For example, the drain of source select gate $210_1$ is connected to the source of memory cell $208_1$ of the corresponding NAND string $206_1$. A control gate 220 of each source select gate 210 is connected to source select line 214.

The drain of each drain select gate 212 is connected to the local bit line 204 for the corresponding NAND string at a bit line contact 228. For example, the drain of drain select gate $212_1$ is connected to the local bit line $204_1$ for the corresponding NAND string $206_1$ at bit line contact $228_1$. The source of each drain select gate 212 is connected to the drain of the last memory cell $208_N$ of the corresponding NAND string 206. For example, the source of drain select gate $212_1$ is connected to the drain of memory cell $208_N$ of the corresponding NAND string $206_1$. A control gate 222 of each drain select gate 212 is connected to drain select line 215.

For some embodiments, where two NAND memory arrays 200 are formed at different levels of a stacked memory array and where only one set of local bit lines $204_1$ to $204_M$ is used for both NAND memory arrays 200, the drains of respective drain select gates 212 of the NAND memory array 200 at one level are respectively electrically coupled (e.g., connected) to or merged with the drains of respective source select gates 212 of the NAND memory array 200 at the other level. This means that each single bit line 204 is electrically coupled (e.g., connected) to a drain select gate 212, and thus the corresponding NAND string 206, of the NAND memory array 200 at one level and to a drain select gate 212, and thus the corresponding NAND string 206, of the NAND memory array 200 at the other level.

Typical construction of memory cells 208 includes a source 230 and a drain 232, a charge storage node 234 (e.g., a floating gate, charge trap, etc.) that can store a charge that determines a data value of the cell, and a control gate 236, as shown in FIG. 2. Memory cells 208 have their control gates 236 coupled to (and in some cases from) a word line 202. A column of the memory cells 208 is a NAND string 206 coupled to a given local bit line 204. A row of the memory cells 208 are those memory cells commonly coupled to a given word line 202.

Note that each source select gate 210 and each drain select gate 21.2 shown in FIG. 2 is non-programmable in that they do not store charges. However, for some embodiments, each source select gate 210 and/or each drain select gate 212 may be a charge storage cell and thus programmable. Each charge storage cell used for a source and/or drain select gate may be configured in a manner similar to a memory cell 208. For example, each charge storage cell acting as a select gate may have charge storage node, such as a charge storage node 234, and a control gate, such as control gate 220 for a source select gate and control gate 222 for a drain select gate.

FIGS. 3A-3E are cross-sectional views of a portion of a stacked (e.g., three-dimensional) memory array 301, such as a portion of memory array 104 of FIG. 1 or memory array 200 of FIG. 2, during various stages of fabrication. Alternatively, memory array 301 may be referred to as a memory chip, e.g., monolithic chip.

FIGS. 3A-3E are cross-sectional views taken along a column direction of memory array 301. FIG. 4A is cross-sectional view taken along line 4A-4A of FIG. 3D and thus along a row direction of memory array 301. FIG. 4B is cross-sectional view taken along line 4B-4B of FIG. 3E and thus along a row direction of memory array 301.

Figure 3A:
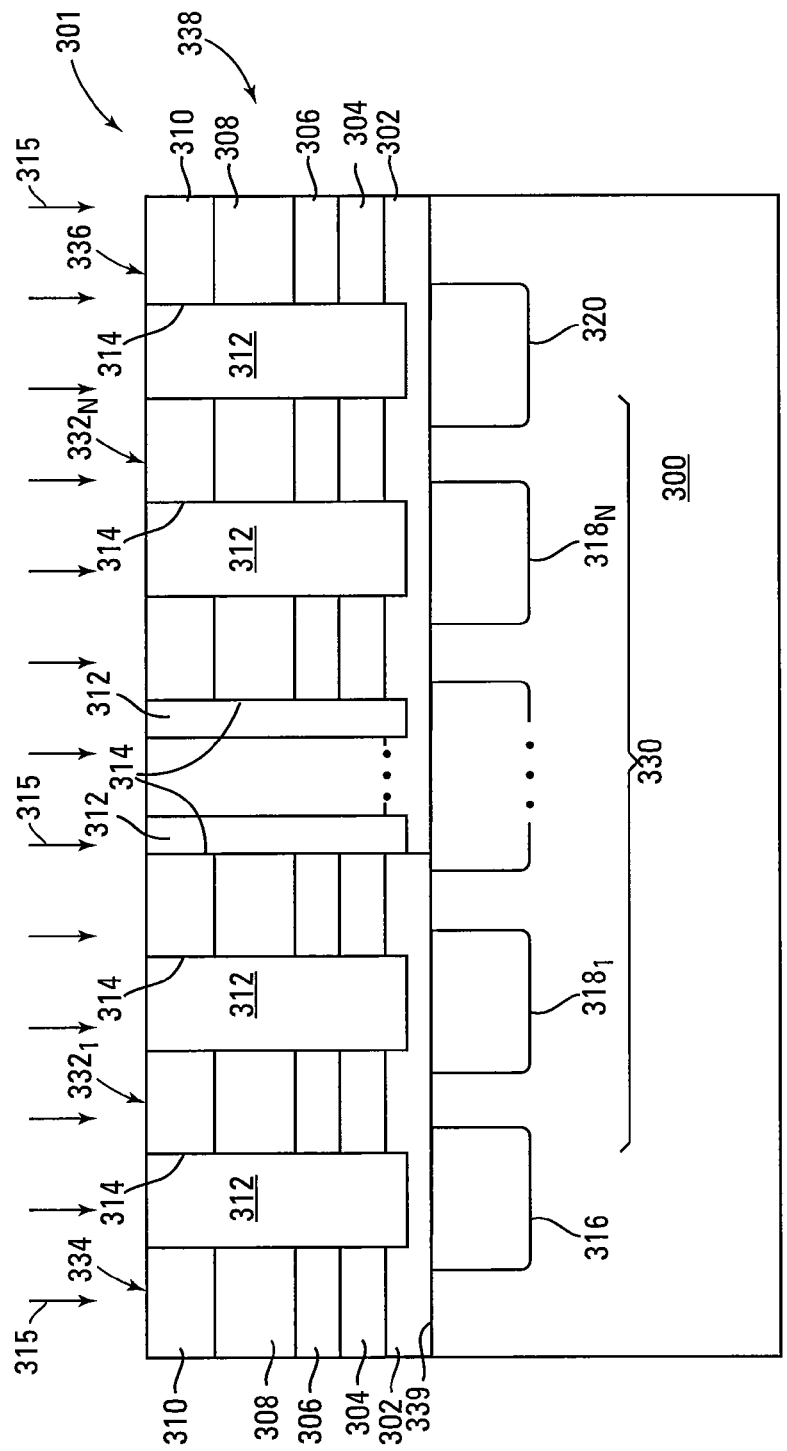
FIGS. 3A-3E are cross-sectional views of a portion of a stacked memory array at various stages of fabrication, according to another embodiment.
Figure 4A:
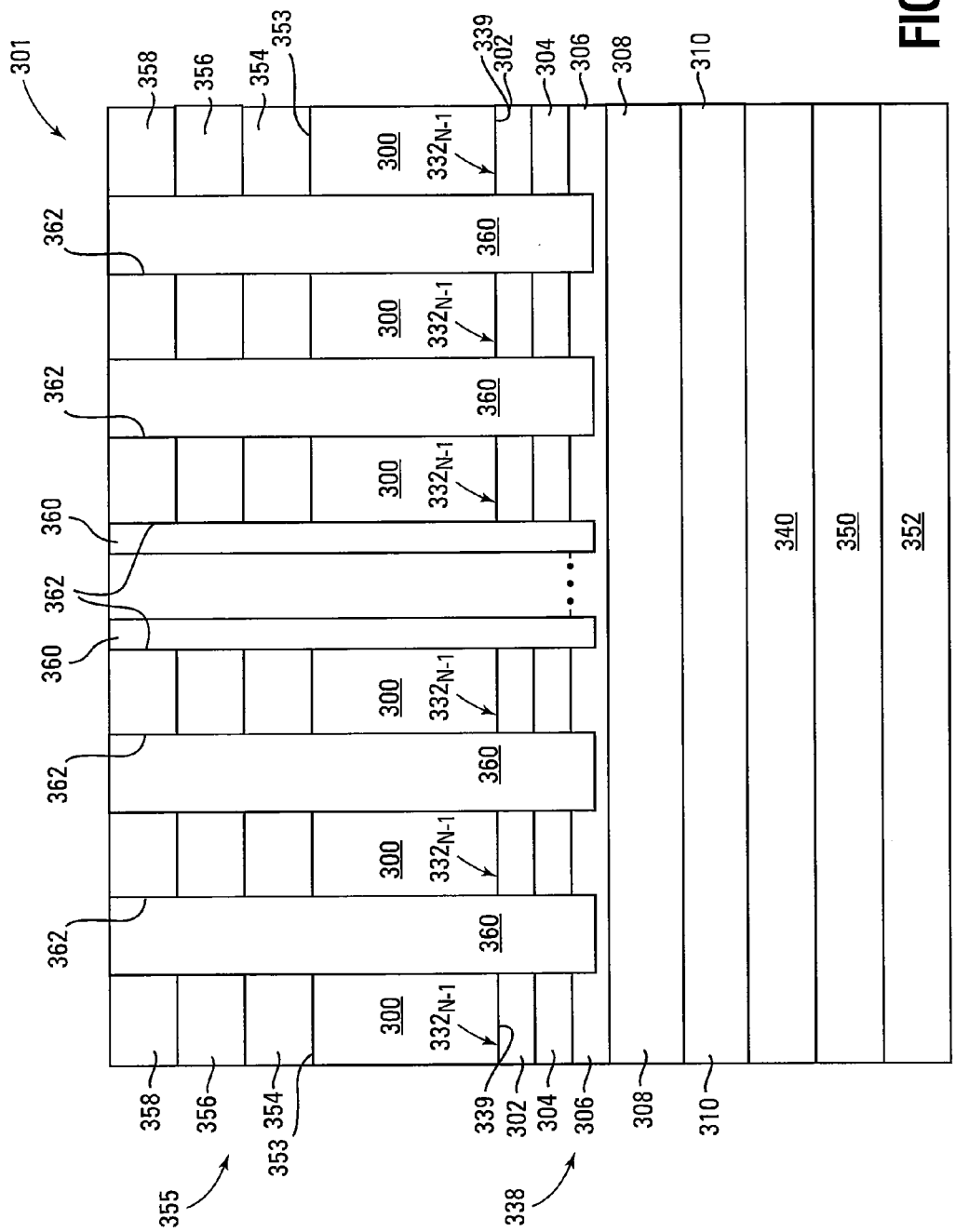
FIG. 4A is cross-sectional view taken along line 4A-4A of FIG. 3D.
Figure 4B:
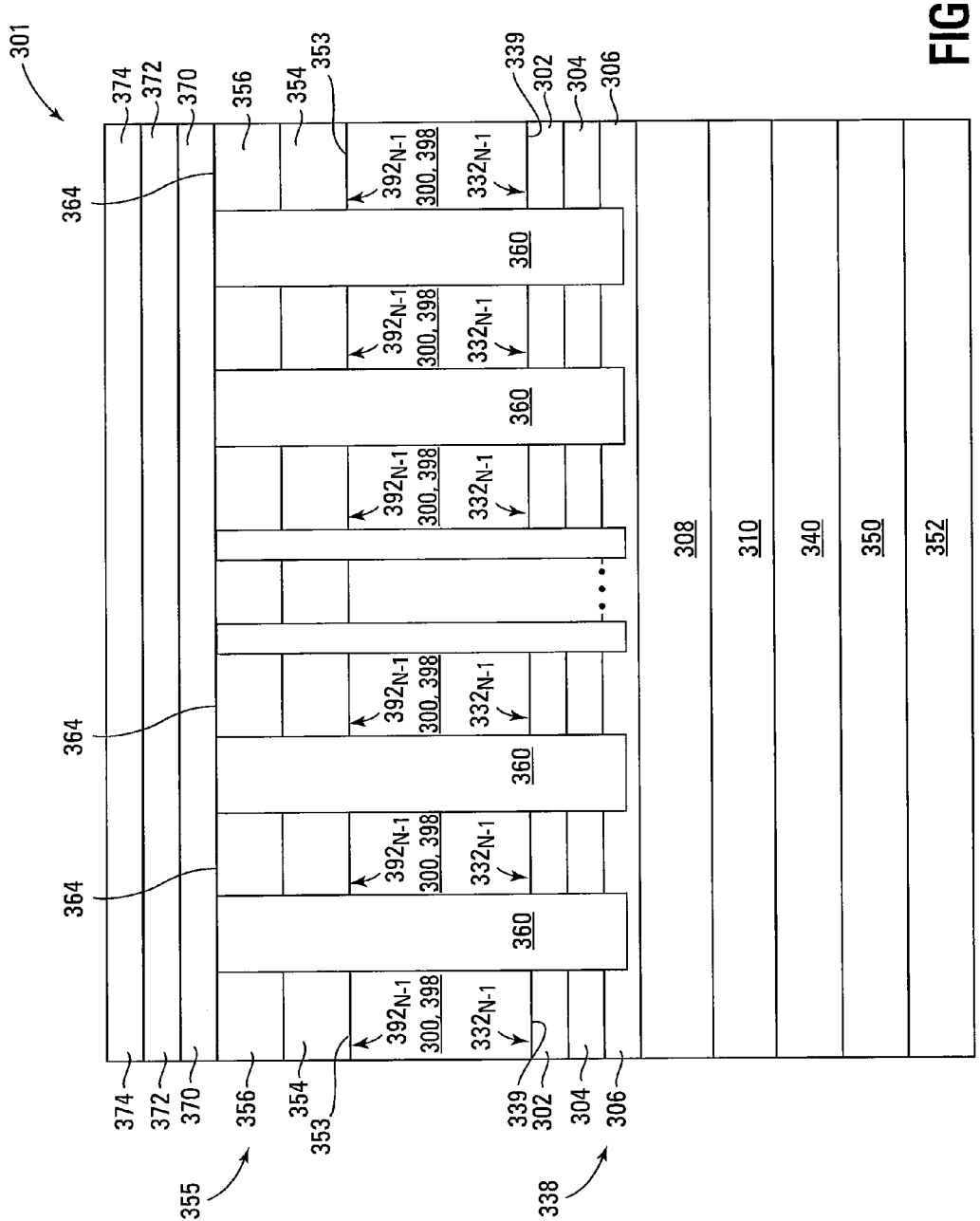
FIG. 4B is cross-sectional view taken along line 4B-4B of FIG. 3E.

In general, for some embodiments, the structure of FIG. 3A is formed by forming a dielectric 302 over a semiconductor 300 that, in some embodiments, may be comprised of silicon that may be conductively doped to have a p-type or n-type conductivity. For example, dielectric 302 is formed over (e.g., on) a first surface (e.g., first outer surface) 339, such as a first side, of semiconductor 300. Dielectric 302 may be formed from an oxide, e.g., silicon oxide, an oxynitride, e.g., silicon oxynitride, etc.

A charge storage node 304 is formed over dielectric 302. A dielectric 306, e.g., an interlayer dielectric, may be formed over charge storage node 304 for some embodiments. Charge storage node 304 may be a floating gate formed from a conductor, such as doped polysilicon. For other embodiments, charge storage node 304 may be a charge trap. For example, the charge trap may be a dielectric, e.g., a high-dielectric constant (high-K) dielectric, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$.

Dielectric 306 can be silicon oxide, nitride, oxynitride, oxide-nitride-oxide (ONO), or other dielectric material. For example, dielectric 306 may be a high-dielectric constant (high-K) dielectric, such as alumina, hafnia ($HfO_2$), or zirconia ($ZrO_2$) with a K of about 20, or praeseodymium oxide ($Pr_2O_3$) with a K of about 30.

The embedded conductive particles of charge storage node 304 may be used to enhance charge retention for a non-volatile memory cell formed therefrom. For some embodiments, the density range of metal particles in charge storage node 304 is in the range of $5 \times 10^{12}$ to $10 \times 10^{13}$ with typical particle sizes in the range of 1-3 nanometers and spaced greater than 3 nanometers apart in the high-K dielectric material. Alternate embodiments can use different densities, particle sizes, and spacing.

The metal particles can be of platinum (Pt), gold (Au), cobalt (Co), iridium (Ir), tungsten (W), or some other metal that can provide deep energy electron and hole traps. The metal particle charge trap may be deposited by sputtering or evaporation at relatively low temperatures.

A conductor 308 is formed over dielectric 306. A protective material (e.g., cap 310), such as a nitride, e.g., a silicon nitride ($Si_3N_4$), may be formed over conductor 308.

Conductor 308 may be of metal, such as tantalum nitride, titanium nitride, tungsten nitride, etc. For some embodiments, conductor 308 may comprise, consist of, or consist essentially of conductively doped polysilicon and/or may comprise, consist of, or consist essentially of metal, such as a refractory metal, or a metal-containing material, such as a refractory metal suicide layer, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

Isolation regions 312 are then formed by patterning cap 310 and forming, e.g., etching, openings 314 through cap 310, conductor 308, dielectric 306, and charge storage node 304, stopping on or within dielectric 302. For example, a mask (not shown), e.g., imaging resist, such as photo-resist, is formed over cap 310 and is patterned to define regions of cap 310, conductor 308, dielectric 306, charge storage node 304, e.g., and a portion of dielectric 302, for removal. The regions defined for removal are subsequently removed, e.g., by etching, such as reactive ion etching, to form openings 314 that terminate on or within dielectric 302, thereby exposing portions of dielectric 302.

Source/drain regions 316, $318_1$-$318_N$, and 320 are then implanted in semiconductor 300, e.g., using cap 310 as a mask, such as indicated by arrows 315 in FIG. 3A. For example, the source/drain regions may have n-type conductivity when semiconductor 300 has p-type conductivity or p-type conductivity when semiconductor 300 has n-type conductivity.

A suitable dielectric material, such as an oxide, e.g., a thermal oxide and/or a high-density-plasma (HDP) oxide, a spin-on dielectric material, e.g., hydrogen silsesquioxane (HSQ), hexamethyldisiloxane, octamethyltrisiloxane, etc., is then deposited in openings 314, e.g., after forming the source/drain regions, and possibly over cap 310, such as by blanket deposition, to form isolation regions 312. Another example for the dielectric would be a doped silicate glass. Examples of doped silicate glasses include BSG (borosilicate glass), PSG (phosphosilicate glass), and BPSG (borophosphosilicate glass). Another example the dielectric would be TEOS (tetraethylorthosilicate). Any dielectric material formed over cap 310 may then removed from cap 310 by chemical mechanical planarization (CMP), as shown in FIG. 3A, so that upper surfaces of isolation regions 312 are substantially flush (e.g., flush) with the upper surface of cap 310.

Isolation regions 312 define a row of memory cells $332_1$ to a row of memory cells $332_N$, e.g., extending perpendicular (substantially perpendicular) to the face plane of FIG. 3A, of a first quasi-two-dimensional (e.g., two-dimensional) non-volatile memory array, such as a NAND flash memory array 338, of stacked memory array 301. An array may be considered to be quasi-two dimensional when the memory cells are formed in substantially a single plane.

Isolation regions 312 (FIG. 3A) electrically isolate the memory cells $332_1$-$332_N$ within a column by passing through the charge storage node 304 of those memory cells. Isolation regions 312 extend substantially in the row direction, e.g., between successive rows of memory cells 332, thereby defining the rows of memory cells. An isolation region 312 is located between a row of source select gates 334 and a row of memory cells $332_1$ and between a row of drain select gates 336 and a row of memory cells $332_N$.

The memory cells $332_1$-$332_N$, source select gate 334, and drain select gate 336, and thus first NAND memory array 338, are formed over and extend outward from surface 339 of semiconductor 300. For some embodiments, each of memory cells 332 may be a single-level cell, programmable to store a single bit, or a multi-level cell, programmable to store multiple bits.

Memory cells 332 are coupled in series by source/drain regions 318 to form a string, e.g., a NAND string 330, of memory cells 332. Note that source/drain region 316 couples source select gate 334 in series with memory cell $332_1$, and thus with NAND string 330, and source/drain region 320 couples drain select gate 336 in series with memory cell $332_N$, and thus with NAND string 330.

Dielectric 302 forms a tunnel dielectric of memory cells 332, and conductor 308 forms a control gate (e.g., a portion of a word line) of each of memory cells 332. Dielectric 302 forms a tunnel dielectric, e.g., tunnel oxide, of source select gate 334 and/or drain select gate 336, in the event that source select gate 334 and/or drain select gate 336 are charge storage cells and are thus programmable. When source select gate 334 and/or drain select gate 336 are programmable, conductor 308 forms a control gate (e.g., a portion of a source select line) of source select gate 334 and/or a control gate (e.g., a portion of a drain select line) of drain select gate 336.

In the event that source select gate 334 and/or drain select gate 336 are non-programmable, dielectric 302 is a gate dielectric, e.g., gate oxide, thereof. When source select gate 334 and/or drain select gate 336 are non-programmable, conductor 308 and the charge storage node 304 thereof may be shorted together to function together as the control gate of source select gate 334 and/or drain select gate 336, in embodiments where charge storage node 304 is formed from a conductor, such as polysilicon. Alternatively, a conductive charge storage node 304 may form the control gate of a non-programmable source select gate 334 and/or drain select gate 336. In other embodiments, charge storage node 304 and dielectric 306 may be removed from the dielectric 302 of a non-programmable source select gate 334 and/or drain select gate 336 before conductor 308 is formed, or they may be masked to inhibit formation, and conductor 308 may be subsequently formed over the dielectric 302 of non-programmable source select gate 334 and/or drain select gate 336 to form the control gate of non-programmable source select gate 334 and/or drain select gate 336.

Figure 3B:
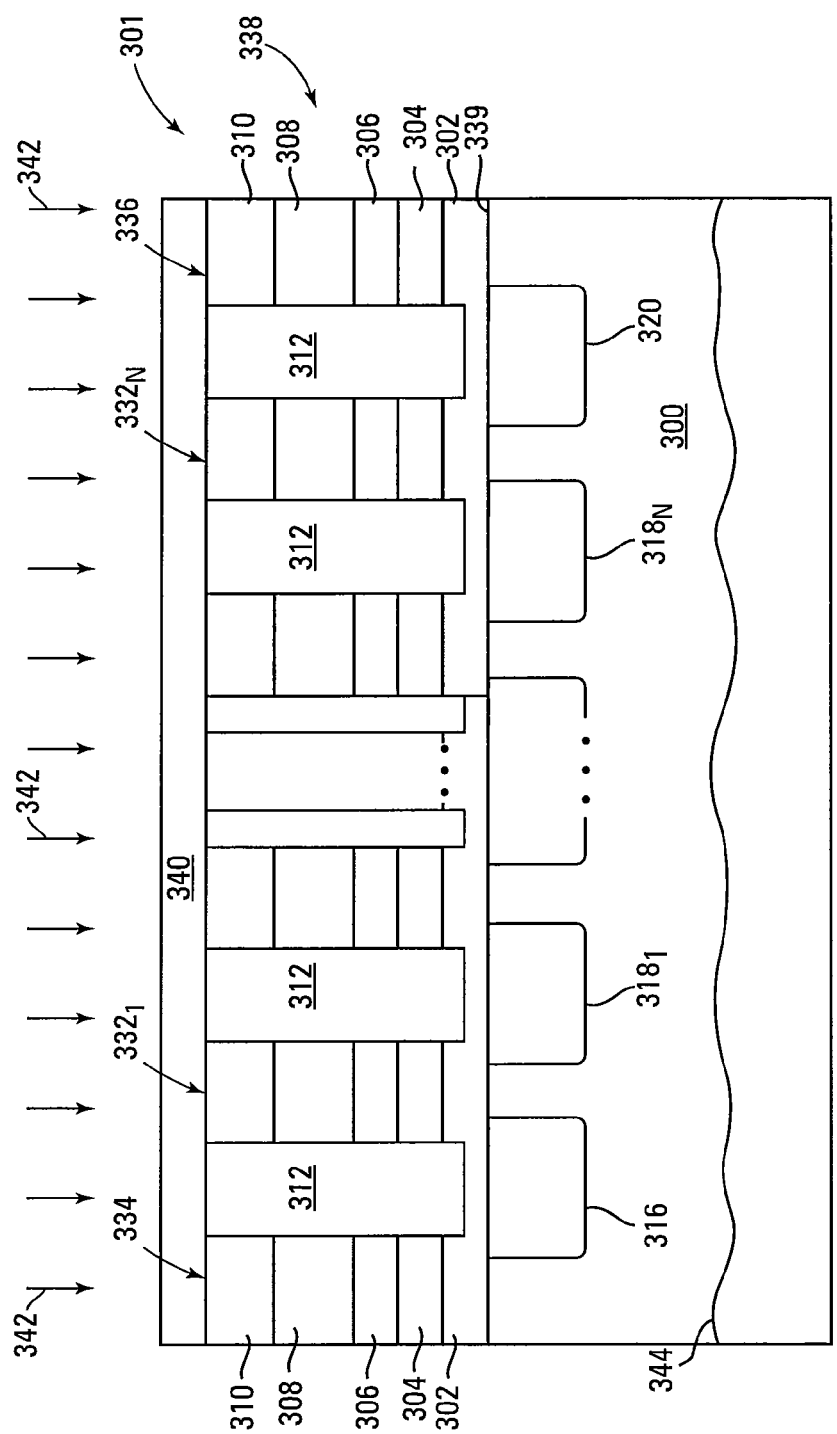

A protective material 340, such as amorphous silicon, is formed over the structure of FIG. 3A, as shown in FIG. 3B. For example, the material 340 may be deposited over cap 310, and thus memory cells 332, source select gate 334, and drain select gate 336, and isolation regions 312. Subsequently, the material 340 may be planarized by CMP.

Semiconductor 300 is further implanted with hydrogen ($H_2$), hydrogen ions ($H^+$), deuterium ($D_2$), deuterium ions ($D^+$) or other suitable implant particles 342 to form a damaged (e.g., stressed) region 344, as shown in FIG. 3B. Common implantation techniques include beam line ion implantation, plasma immersion ion implantation and ion shower. In general, the implant particles 342 are small-mass particles chosen to pass through a portion of semiconductor 300 to a particular distance (e.g., in the range of about 2000 to about 4000 Angstroms) within semiconductor 300 from surface 339 without causing significant damage due to its passage. This determines the thickness of semiconductor 300 after semiconductor 300 is cleaved at damaged region 344. For one embodiment, the dosage in the damaged region 344 is approximately $5 \times 10^{16}$ particles/cm². For a further embodiment, the dosage in the damaged region 344 is in the range of approximately $10^{15}$ to $10^{18}$ particles/cm². The damaged region 334 is formed to allow for subsequent cleaving of semiconductor 300. This process is commonly known as "Smart Cut" and is well understood in the art.

Figure 3C:
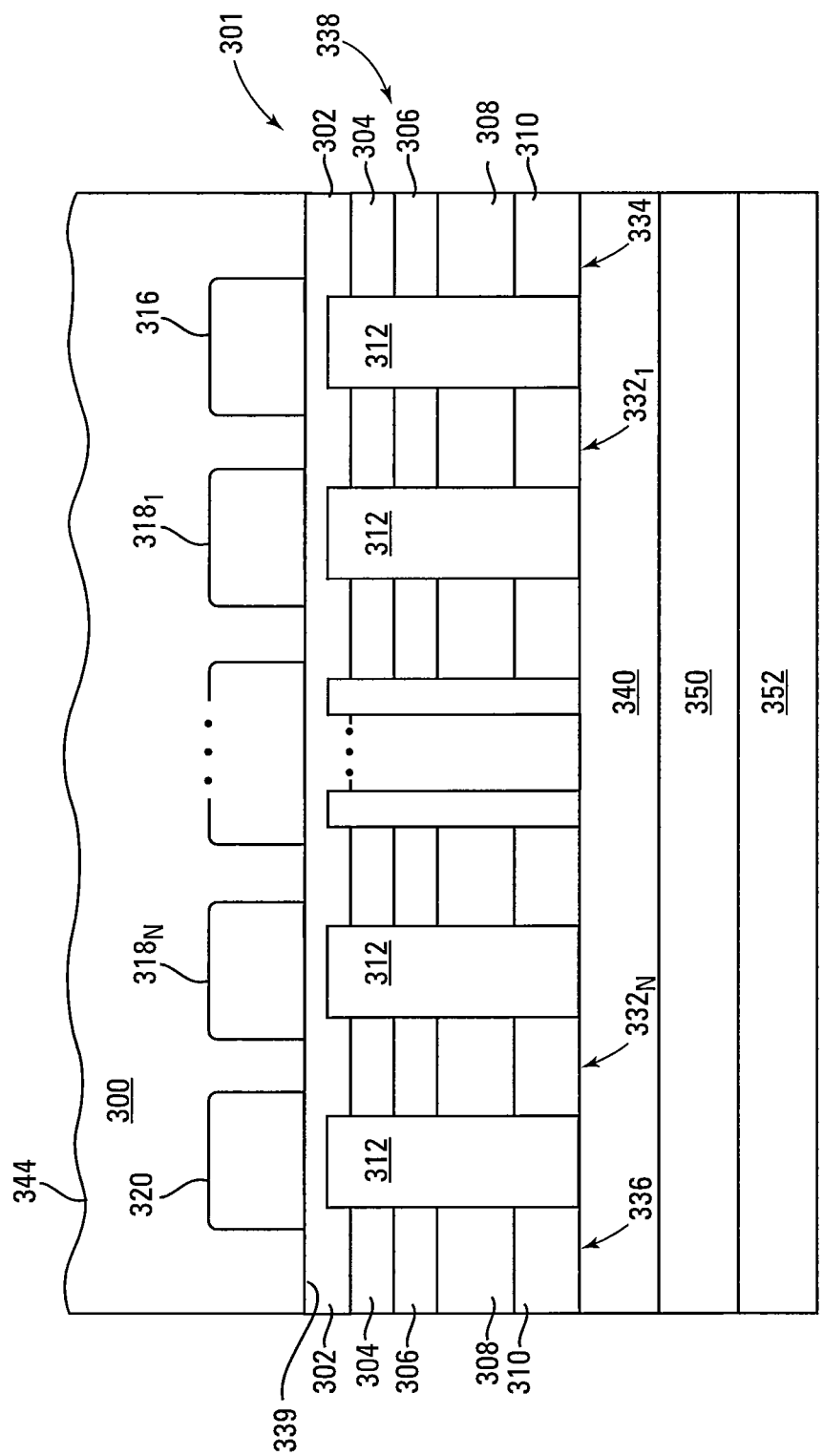

A dielectric 350, such as an oxide, is formed on a semiconductor 352, and is subsequently bonded, e.g., covalently or ionically, to the protective material 340, as shown in FIG. 3C. Note that the structure in FIG. 3C is inverted relative to FIG. 3B. Semiconductor 352 is sometimes referred to as a handle wafer, in that it is used to handle the structure to which it is attached, e.g., semiconductor 352 is used as a wafer handle during cleaving of semiconductor 300. Dielectric 350 is sometimes referred to as a buried dielectric, e.g., a buried oxide (BOX).

Semiconductor 300 is cleaved in FIG. 3C at the damaged region 344. The cleaving process generally involves heating (e.g., often called annealing) semiconductor 300 to a temperature sufficient to fracture the substrate at the damaged region 344, followed by separation of semiconductor 300 at the damaged region 344. For example, heating, may produce bubbles of the particle 342 material within semiconductor 300, e.g., that may produce blistering at the damaged region 344. While blistering at the damaged region 344 may have occurred, causing deformation of the substrate 102, cleaving reduces the stress in the damaged region 344 and has a tendency to relax any such deformation.

Figure 3D:
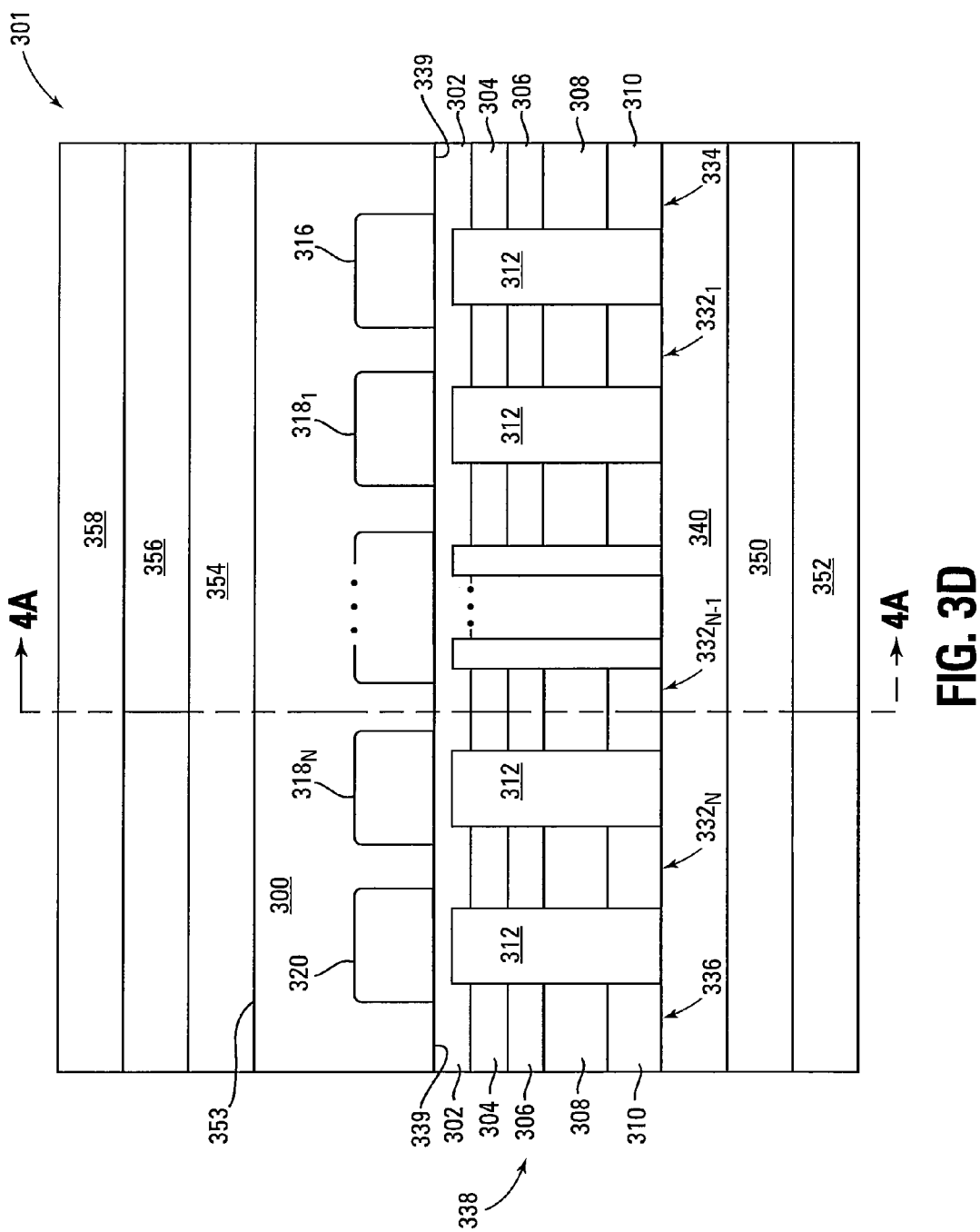
Figure 3E:
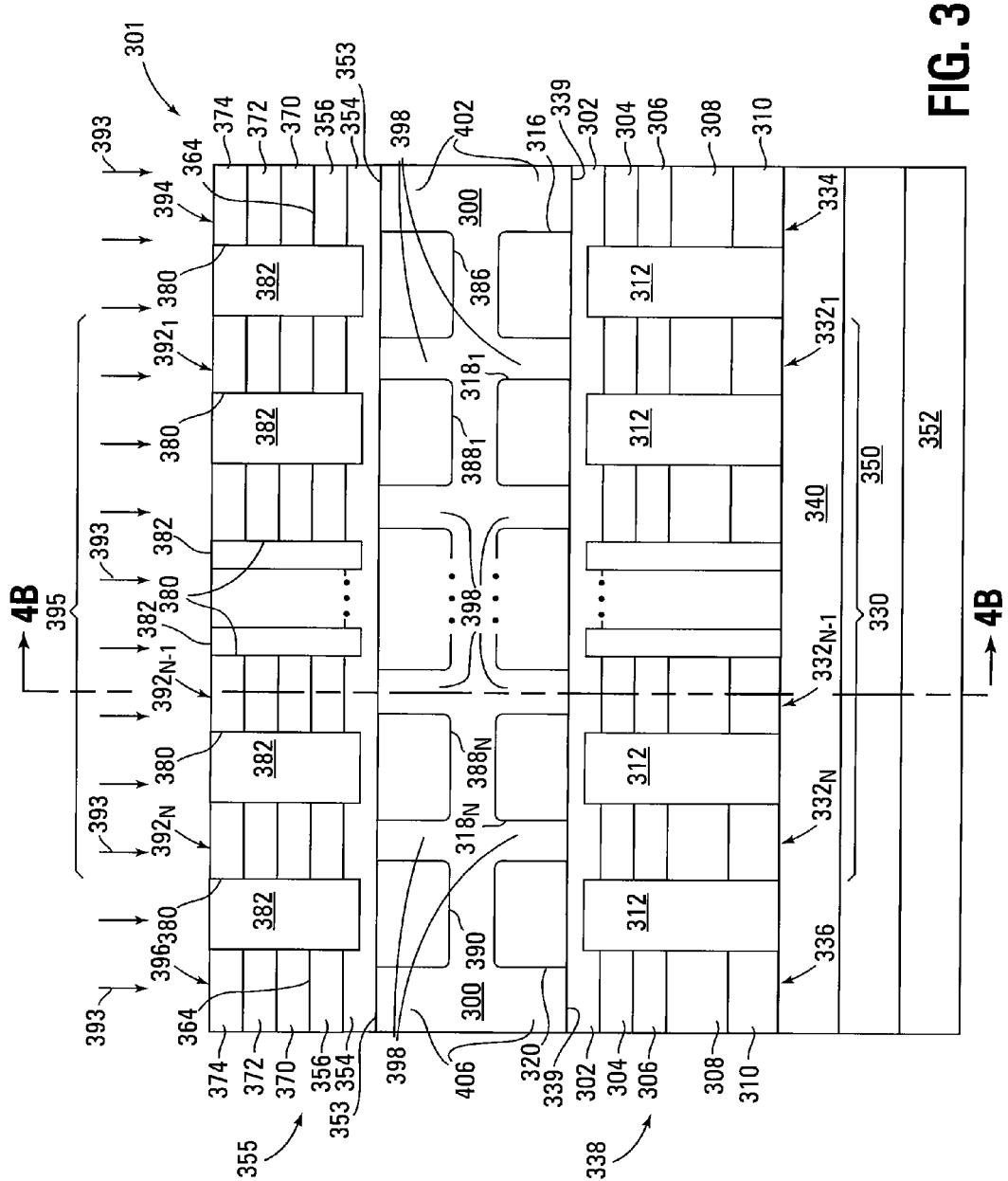

The exposed (e.g., cleaved) surface of semiconductor 300 is planarized, such as by CMP, as shown in FIG. 3D. At this point, any remaining deformation from blistering of the damaged region 344 is removed. This forms a planar second surface (e.g., second outer surface) 353, such as a second side, of semiconductor 300 that faces in a direction opposite first surface 339 of semiconductor 300 over which a second two-dimensional (e.g., quasi-two-dimensional) non-volatile memory array, such as a NAND flash memory array 355, of memory cells is formed, as shown and FIG. 3E. For example, the arrays 338 and 355 are formed at different vertical levels to form stacked memory array 301, as shown in FIGS. 3E and 4B, where the memory cells of memory array 338 extend outwardly away from first surface 339, and the memory cells of memory array 355 extend outwardly away from second surface 353, in direction substantially opposite (e.g., opposite) to that of the memory cells of memory array 338.

Viewed in another way, stacked memory array 301 may be considered to have a back-to-back configuration since memory array 338 and memory array 355 extend in opposite directions from opposing sides of semiconductor 300. As described below, electrically isolated portions of the semiconductor 300 form common channel regions that are shared by NAND strings of arrays 338 and 355. That is, each isolated portion of semiconductor 300 can be shared by (e.g., coupled to) one NAND string of array 338 and one NAND string of array 355. Formation of memory array 355 over second surface 353 will now be described.

A dielectric 354 is subsequently formed over surface 353 of the portion of semiconductor 300 remaining after cleaving and planarizing, as shown in FIGS. 3D and 4A. Dielectric 354 may be formed from an oxide, e.g., silicon oxide, an oxynitride, e.g., silicon oxynitride, etc.

A charge storage node 356 is then formed over dielectric 354, as shown in FIGS. 3D and 4A. Charge storage node 356 may be a floating gate formed from a conductor, such as doped polysilicon. For other embodiments, charge storage node 356 may be a charge trap. For example, the charge trap may be a dielectric, e.g., a high dielectric constant (high-K) dielectric, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$.

A sacrificial material 358, such as oxide, polysilicon over oxide, etc., is formed, e.g., deposited, over charge storage node 356, as shown in FIGS. 3D and 4A. Isolation regions 360 are then formed by forming, e.g., etching, openings 362 through sacrificial material 358, charge storage node 356, dielectric 354, semiconductor 300 (i.e., the portion of semiconductor remaining after cleaving and planarizing), dielectric 302, and charge storage node 304, stopping on or within dielectric 306, as shown in FIG. 4A. For example, a mask (not shown), e.g., imaging resist, such as photo-resist, is formed over sacrificial material 358 and is patterned to define areas of sacrificial material 358, charge storage node 356, dielectric 354, semiconductor 300, dielectric 302, and charge storage node 304 for removal, stopping on or within dielectric 306. The areas defined for removal are subsequently removed, e.g., by etching, such as reactive ion etching, to form openings 362 that terminate on or within dielectric 306, thereby exposing portions of dielectric 306.

A suitable dielectric material, such as an oxide, e.g., a thermal oxide and/or a high-density-plasma (HDP) oxide, a spin-on dielectric material, e.g., hydrogen silsesquioxane (HSQ), hexamethyldisiloxane, octamethyltrisiloxane, etc., is then deposited in openings 362, e.g., after forming the source/drain regions, and possibly over sacrificial material 358, such as by blanket deposition, to form isolation regions 360. Any dielectric material formed over sacrificial material 358 may then removed from sacrificial material 358 by CMP, as shown in FIG. 4A, so that upper surfaces of isolation regions 360 are substantially flush (e.g., flush) with the upper surface of sacrificial material 358. For example, the upper surfaces of isolation regions 360 are substantially co-planar (e.g., co-planar) with the upper surface of sacrificial material 358.

Isolation regions 360 define columns of memory cells 332 of memory array 338, e.g., extending substantially perpendicular (e.g., perpendicular) to the face plane of FIG. 4A. Isolation regions 360 electrically isolate the memory cells (e.g., memory cells $332_{N-1}$) of first memory array 338 within a row of memory cells of memory array 338 by passing through the charge storage node 304 of those memory cells. Isolation regions 360 extend substantially in the column direction (e.g., extend in the column direction), e.g., between successive columns of memory cells 332, and thus successive NAND strings 330. The respective columns of memory array 338 may at least include a NAND string 330 and source select gate 334 and drain select gate 336 coupled thereto.

Isolation regions 360 are then recessed, e.g., using a wet etch, such as a buffered oxide etch (BOE) or a buffered hydrofluoric acid (BHF) etch, below the upper surface of sacrificial material 358 to the level of the upper surface of charge storage node 356, e.g., so that the upper surfaces of isolation regions 360 are substantially flush (e.g., flush) with the upper surface of charge storage node 356, as shown in FIG. 4B. For example, a portion of the isolation regions 360 is removed substantially to the level (e.g., removed to the level) of the upper surface of charge storage node 356.

Then, sacrificial material 358 is removed, stopping on charge storage node 356. For example, sacrificial material 358 may be removed using a selective etch, such as a TMAH etch, that is selective over the isolation regions 360 and charge storage node 356 so that substantially only (e.g., only) sacrificial material 358 is removed, leaving a substantially planar (e.g., planar) surface 364, including the substantially coplanar (e.g., coplanar) upper surfaces of isolation regions 360 and of charge storage node 356, as shown in FIG. 4B.

A dielectric 370, e.g., an interlayer dielectric, may be formed over charge storage node 356 and isolation regions 360, e.g., over surface 364, as shown in FIGS. 3E and 4B, for some embodiments. Dielectric 370 can be silicon oxide, nitride, oxynitride, oxide-nitride-oxide (ONO), or other dielectric material. For example, dielectric 370 may be a high dielectric constant (high-K) dielectric, such as alumina, hafnia ($HfO_2$), or zirconia ($ZrO_2$) with a K of about 20, or praeseodymium oxide ($Pr_2O_3$) with a K of about 30.

A conductor 372 is formed over dielectric 370. A protective material (e.g., cap 374), such as a nitride, e.g., a silicon nitride ($Si_3N_4$), may be formed over conductor 372, as shown in FIGS. 3E and 4B.

Conductor 372 may be of metal, such as tantalum nitride, titanium nitride, tungsten nitride, etc. For some embodiments, conductor 372 may comprise, consist of, or consist essentially of conductively doped polysilicon and/or may comprise, consist of, or consist essentially of metal, such as a refractory metal, or a metal-containing material, such as a refractory metal silicide layer, as well as any other conductive material.

Openings 380 are then formed, e.g., by etching, through cap 374, conductor 372, dielectric 370, and charge storage node 356, stopping on or within dielectric 354, as shown in FIG. 3E. For example, a mask (not shown), e.g., imaging resist, such as photo-resist, is formed over cap 374 and is patterned to define areas of cap 374, conductor 372, and dielectric 370, and charge storage node 356 for removal, stopping on or within dielectric 354. The areas defined for removal are subsequently removed, e.g., by etching, such as reactive ion etching, to form openings 380 that terminate on or within dielectric 354, thereby exposing portions of dielectric 354.

Source/drain regions 386, $388_1$-$388_N$ and 390 are then implanted in semiconductor 300, e.g., using cap 374 as a mask, as shown by arrows 393 in FIG. 3E. For example, the source/drain regions may have n-type conductivity when semiconductor 300 has p-type conductivity or p-type conductivity when semiconductor 300 has n-type conductivity.

Isolation regions 382 are then formed in openings 380 from a dielectric so that an upper surface of isolation regions 382 is substantially flush (e.g., flush) with upper surface of cap 374, as shown in FIG. 3E. One example for the dielectric would be a doped silicate glass. Examples of doped silicate glasses include BSG (borosilicate glass), PSG (phosphosilicate glass), and BPSG (borophosphosilicate glass). Other examples of the dielectric would be TEOS (tetraethylorthosilicate), oxide, e.g., a thermal oxide and/or a high-density-plasma (HDP) oxide, a spin-on dielectric material, e.g., hydrogen silsesquioxane (HSQ), hexamethyldisiloxane, octamethyltrisiloxane, etc.

Isolation regions 382 define rows, e.g., extending in a direction substantially perpendicular (e.g., perpendicular) to the face plane of FIG. 3E, of memory cells 392 of memory array 355. For example, isolation regions 382 define a row of memory cells $392_1$ to a row of memory cells $392_N$ of NAND memory array 355. Memory cells $392_1$-$392_N$, source select gate 394, and drain select gate 396, and thus memory array 355, are formed over surface 353 of semiconductor 300 and extend outward from second surface 353 of semiconductor 300 in a direction opposite to direction from which memory cells $332_1$-$332_N$, source select gate 334, and drain select gate 336, and thus memory array 338, extend from surface 339 of semiconductor 300, as shown in FIG. 3E. For some embodiments, each of memory cells 392 may be a single-level cell programmable to store a single bit (i.e., one of two data values) or a multi-level cell programmable to store multiple bits (i.e., one of more than two data values).

Isolation regions 382 electrically isolate memory cells $392_1$-$392_N$ from each other within a column of memory array 355 by passing through the charge storage node 356 of those memory cells $392_1$-$392_N$. An isolation region 382 isolates memory cell $392_1$ from source select gate 394, and an isolation region 382 isolates memory cell $392_N$ from source select gate 396.

Memory cells 392 are coupled in series by source/drain regions 388 to form a string, e.g., a NAND string 395, of memory cells 392. Source/drain region 386 couples source select gate 394 in series with memory cell $392_1$, and thus with NAND string 395, and source/drain region 390 couples drain select gate 396 in series with memory cell $392_N$, and thus with NAND string 395.

Dielectric 354 forms a tunnel dielectric, e.g., tunnel oxide, of memory cells 392, and conductor 372 forms a control gate (e.g., a portion of a word line) of each of memory cells 392. Dielectric 354 forms a tunnel dielectric, e.g., tunnel oxide, of source select gate 394 and/or drain select gate 396, in the event that source select gate 394 and/or drain select gate 396 are charge storage cells and are thus programmable. When source select gate 394 and/or drain select gate 396 are programmable, conductor 372 forms a control gate (e.g., a portion of a source select line) of source select gate 394 and/or a control gate (e.g., a portion of a drain select line) of drain select gate 396.

Note that FIG. 4B shows a row of memory cells, e.g., a row of memory cells $332_{N-1}$, of memory array 338 commonly coupled to a word line, e.g., a portion of which is formed by conductor 308, and a row of memory cells, e.g., a row of memory cells $392_{N-1}$, of memory array 355 commonly coupled to a word line, e.g., a portion of which is formed by control gate 372. Isolation regions 360 electrically isolate the memory cells $332_{N-1}$ of memory array 338 within the row by passing through the charge storage node 304 of those memory cells and electrically isolate the memory cells $392_{N-1}$ of memory array 355 within the row by passing through the charge storage node 356 of those memory cells.

Isolation regions 360 extend substantially vertically (e.g., vertically) from dielectric 370, through charge storage node 356, dielectric 354, and semiconductor 300, through dielectric 302 and charge storage node 304, and terminate within dielectric 306.

Isolation regions 360 extend in the row direction and may be substantially perpendicular (e.g., perpendicular to) isolation regions 382 and substantially perpendicular (e.g., perpendicular to) isolation regions 312. Note that isolation regions 360 run substantially parallel (e.g., parallel) to the face plane of FIG. 3E. Since isolation regions 360 pass through charge storage node 356 (FIG. 4B) and isolation regions 382 pass through charge storage node 356 (FIG. 3E), isolation regions 360 intersect (e.g., pass through portions of) isolation regions 382. Since isolation regions 360 pass through charge storage node 304 (FIG. 4B) and isolation regions 312 pass through charge storage node 304 (FIG. 3E), isolation regions 360 intersect (e.g., pass through portions of) isolation regions 312.

In the event that source select gate 394 and/or drain select gate 396 are non-programmable, dielectric 354 is a gate dielectric, e.g., gate oxide, thereof. When source select gate 394 and/or drain select gate 396 are non-programmable, conductor 372 and the charge storage node 356 thereof may be shorted together to function as the control gate of source select gate 394 and/or drain select gate 396, in embodiments where charge storage node 356 is formed from a conductor, such as polysilicon. Alternatively, a conductive charge storage node 356 may form the control gate of a non-programmable source select gate 394 and/or drain select gate 396. In other embodiments, charge storage node 356 and dielectric 372 may be removed from the dielectric 354 of a non-programmable source select gate 394 and/or drain select gate 396 before conductor 372 is formed, or they may be masked to inhibit formation, and conductor 372 may be subsequently formed over the dielectric 354 of non-programmable source select gate 394 and/or drain select gate 396 to form the control gate of non-programmable source select gate 394 and/or drain select gate 396.

As best seen in FIG. 3E, the semiconductor 300 is interposed between memory arrays 338 and 355. For example, a NAND string 330 of memory array 338 and a NAND string 395 of memory array 355 share channel regions 398 in semiconductor 300. In other words, during operation of either or both NAND string 330 of memory array 338 and NAND string 395 of memory array 355, a channel(s) can be formed in a shared region(s) 398 of semiconductor 300 between adjacent (e.g., successively adjacent) electrically-coupled source/drain regions 318 and 388. As best seen in FIG. 4B, each channel region 398 is coupled to (shared by) a memory cell (e.g., memory cell $332_{N-1}$) of a NAND string 330 and a memory cell (e.g., memory cell $392_{N-1}$) of a NAND string 395.

Similarly, source select gates 334 and 394 share a channel region 402 (e.g., a source select gate channel region) in semiconductor 300. Drain select gates 336 and 396 share a channel region 406 (e.g., a drain select gate channel region) in semiconductor 300.

A source/drain region of drain select gate 336, formed in semiconductor 300, may be electrically coupled to a source/drain region of drain select gate 396, formed in semiconductor 300 (not shown). The electrically coupled source/drain regions may be electrically coupled by a contact formed in semiconductor 300 or they may merge together within semiconductor 300 to form a single, continuous source/drain region that extends from surface 339 to surface 353. The electrically coupled source/drain regions are commonly coupled to a single data line, such as a bit line. That is, the electrically coupled source/drain regions couple the single bit line to both of NAND strings 330 and 395.

Dielectric 302 of memory array 338 may be contiguous (e.g., continuous) from source select gate 334 to drain select gate 336, and dielectric 354 of memory array 355 may be contiguous (e.g., continuous) from source select gate 394 to drain select gate 396, as shown in FIG. 3E. Dielectrics 302 and 354 may be respectively in contact (e.g., direct physical contact) with opposing surfaces 339 and 353 (e.g., opposing sides) of semiconductor 300.

The location of damaged region 344 (FIG. 4B) determines a particular thickness (e.g., about 2000 to about 4000 Angstroms) of semiconductor 300, and thus of the channel regions formed therefrom, and thus a particular separation distance between memory arrays 338 and 355. That is, the location of damaged region 344 determines a particular distance (e.g., about 2000 to about 4000 Angstroms) between surfaces 339 and 353. The location of damaged region 344 is selected to produce a particular thickness of semiconductor 300 (e.g., a particular distance between surfaces 339 and 335) that acts to reduce (e.g., substantially eliminate) the interference between memory arrays 338 and 355. For example, the thickness of semiconductor 300 between NAND strings 330 and 395 in FIG. 3E is selected, based on the selected location of damaged region 344, to substantially eliminate the interference between those NAND strings. For example, the thickness of semiconductor 300 between a memory cell $332_{N-1}$ and a memory $392_{N-1}$ in FIG. 4B is selected to substantially eliminate the interference between those memory cells.

A common source line (not shown), such as common source line 216 of memory array 200 (FIG. 2), may be formed through an isolation region (not shown), e.g., formed from the dielectric that forms isolation regions 382 on the right side of source select gate 394 in FIG. 3E. The common source line is electrically coupled (e.g., connected) to each of source select gates 334 and 394 through source/drain regions thereof that are formed in semiconductor 300.

A dielectric (not shown), e.g., silicon oxide, TEOS, silicon nitride, silicon oxynitride or other dielectric, may be formed over the source line, cap 374, and isolation regions 382 followed by a conductor (not shown), e.g., metal, such as aluminum, formed over that dielectric. The conductor may be patterned, etched, and processed, e.g., using standard processing, to produce individual bit lines, such as bit lines 204 of FIG. 2, where one such bit line may be electrically coupled (e.g., connected), e.g., with a bit line contact, such as a bit line contact 228 in FIG. 2, to both drain select gates 336 and 396 through electrically coupled source/drain regions that pass through semiconductor 300.

Figure 5:
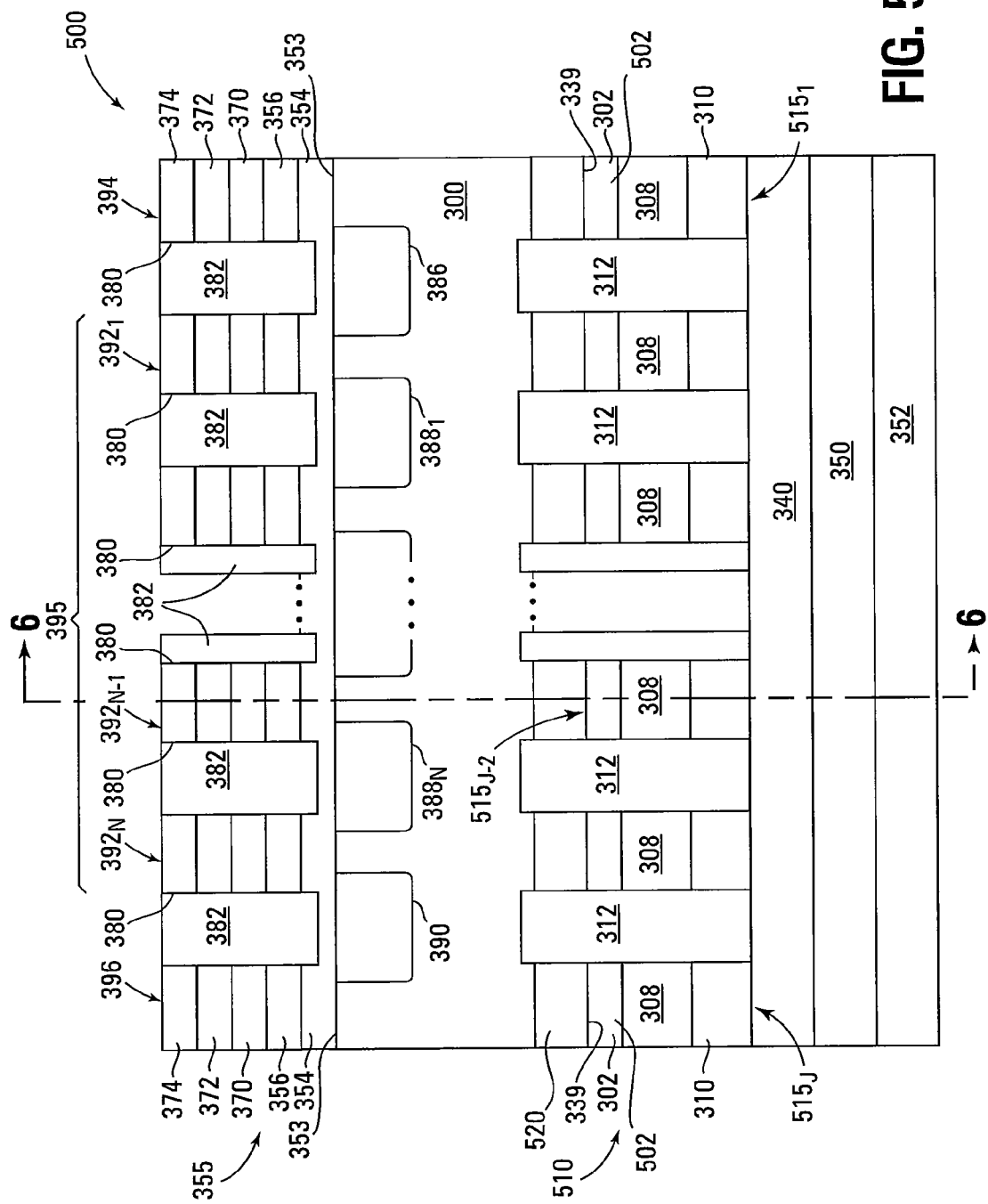
FIG. 5 is a cross-sectional view of a portion of stacked hybrid memory array, according to another embodiment.
Figure 6:
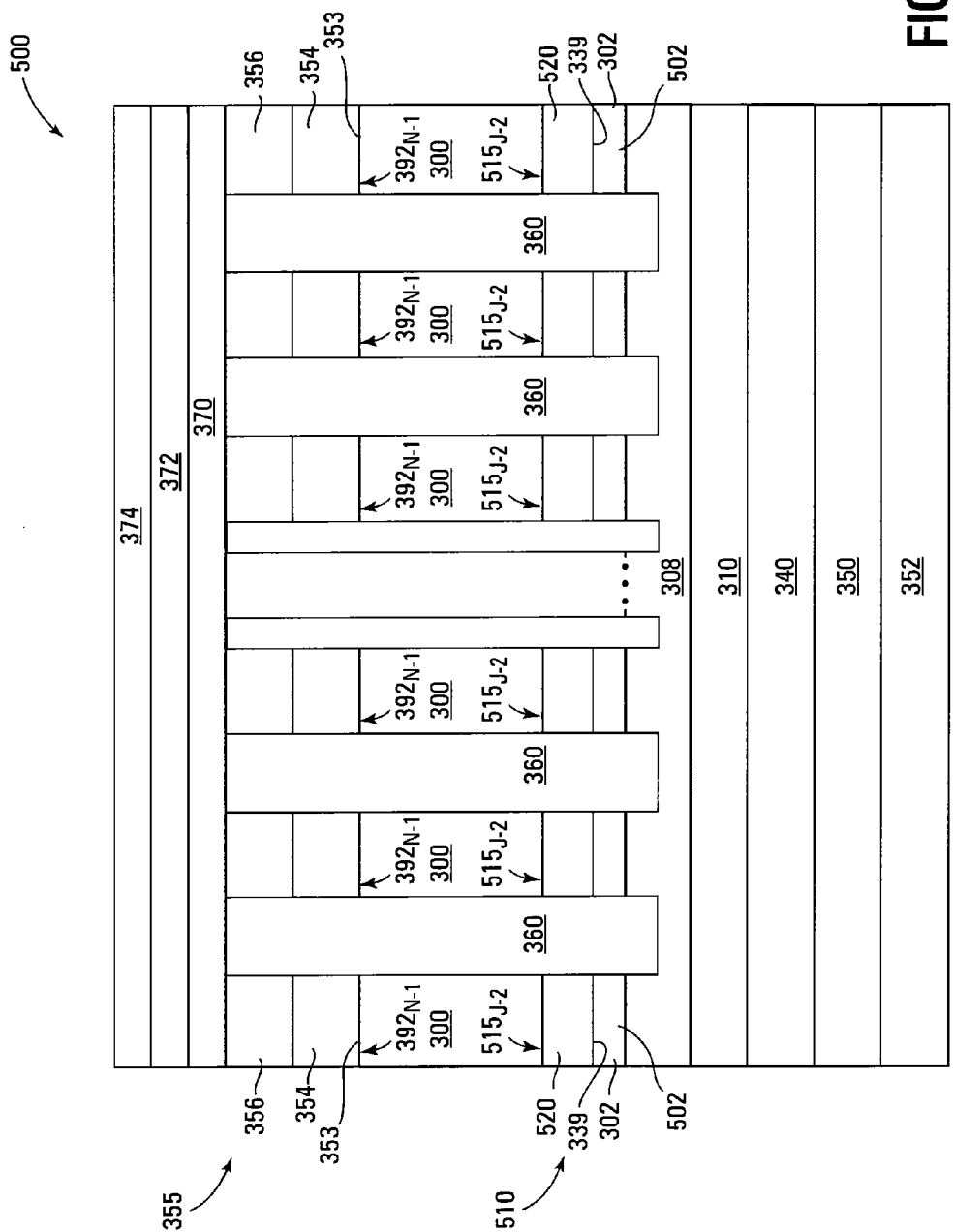
FIG. 6 is a cross-sectional view taken along line 6-6 of FIG. 5.

FIGS. 5 and 6 are cross-sectional views of a stacked (e.g., three-dimensional) hybrid memory array 500, such as a monolithic chip. FIG. 5 is taken along a column direction. FIG. 6 is a cross-sectional view taken along line 6-6 of FIG. 5 and thus along a row direction. Common numbering is used in FIGS. 5 and 6 and FIGS. 3A-3E and 4A-4B to denote common or similar elements.

Stacked hybrid memory array 500 might include the two-dimensional (e.g., quasi-two-dimensional) NAND memory array 355, formed over and extending from the surface 353 of semiconductor 300. Stacked hybrid memory array 500 also includes a two-dimensional (e.g., quasi-two-dimensional) one-time-programmable memory array 510 formed over and extending from (in a direction opposite from which memory array 355 extends from surface 353) the surface 353 of semiconductor 300. For example, NAND memory array 355 and one-time-programmable memory array 510 are coupled to and extend in opposite directions from opposing sides of semiconductor 300. Memory array 510 includes one-time programmable memory cells $515_1$-$515_J$, columns and rows of which are respectively shown in FIGS. 5 and 6. Memory cells 515 include the dielectric 302 that forms an anti-fuse 502 thereof. The conductor 308 is formed over anti-fuse 502 and forms a control gate of memory cells 515. Cap 310 is formed over conductor 308.

Stacked hybrid memory array 500 is formed essentially as described above in conjunction with FIGS. 3A-3E and 4A-4B for stacked memory array 301, with the following notable exceptions:

Formation of memory array 510 is as described above in conjunction with FIG. 3A for memory array 338, except charge storage node 304 and dielectric 306 are omitted and conductor 308 is formed over dielectric 302. The forming of source/drain regions 316, $318_1$-$318_N$ and 320 in semiconductor 300 is also omitted and processing continues as described above in conjunction with FIGS. 3A-3E and 4A-4B.

Source/drain regions 316, $318_1$-$318_N$, and 320 are replaced by a conductive (e.g., conductively doped) region 520 implanted in semiconductor 300 and having a different conductivity type than semiconductor 300, e.g., conductive region 520 may have n-type conductivity when semiconductor 300 has p-type or p-type conductivity when semiconductor 300 has n-type. Conductive region 520 may be implanted through surface 353 before or after forming memory array 355. Alternatively, conductive region 520 may be implanted through surface 339 before or after forming memory array 510. Conductive region 520 is coupled to (e.g. is in direct contact with) dielectric 302 of memory cells 515 and extends from surface 339 into semiconductor 300 in a direction opposite from which memory cells 515 extend, as shown in FIGS. 5 and 6.

Isolation regions 360 extend substantially vertically (e.g., vertically) from dielectric 370, through charge storage node 356, dielectric 354, and semiconductor 300, through conductive region 520 and dielectric 302, and terminate within conductor 308, as shown in FIG. 6. Isolation regions 360 define columns of memory cells 515 of memory array 510. That is, isolation regions 360 electrically isolate the memory cells (e.g., memory cells $515_{j\text{-}2}$) within a row of memory cells of memory array 510 by passing through anti-fuse 502 and conductive region 520. Isolation regions 360 further define columns memory cells 392 of memory array 355, as shown in FIG. 6. That is, isolation regions 360 further electrically isolate the memory cells (e.g., memory cells $392_{N\text{-}1}$) within a row of memory cells of memory array 355 by passing through the charge storage node 356 of those memory cells.

Isolation regions 312 define a row of memory cells $515_1$ to a row of memory cells $515_j$ of memory array 510. Isolation regions 312 (FIG. 5) electrically isolate memory cells $515_1$-$515_j$ from each other within a column of memory cells by passing through conductor 308 of those memory cells, through dielectric 302 (e.g., anti-fuse 502), and through conductive region 520. Isolation regions 312 extend (substantially) in the row direction, e.g., between successive rows of memory cells 515. Isolation regions 360 extend (substantially) in the column direction, e.g., between successive columns of memory cells 515. Isolation regions 382 define a row of memory cells $392_1$ to a row of memory cells $392_N$ of NAND memory array 355 of stacked memory array 500. Isolation regions 382 (FIG. 5) electrically isolate memory cells $392_1$-$392_N$ from each other within a column of memory cells by passing through conductor 372 of those memory cells.

Note that isolation regions 360 run substantially parallel (e.g., parallel) to the face plane of FIG. 5. Since isolation regions 360 pass through charge storage node 356 (FIG. 6) and isolation regions 382 pass through charge storage node 356 (FIG. 5), isolation regions 360 intersect (e.g., pass through portions of) isolation regions 382. Since isolation regions 360 pass through anti-fuse 502 and extend into conductor 308 (FIG. 6) and isolation regions 312 pass through conductor 308, through anti-fuse 502, and through conductive region 520 (FIG. 5), isolation regions 360 intersect (e.g., pass through portions of) isolation regions 312.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A memory, comprising:
   a first array of first memory cells extending in a first direction from a first surface of a semiconductor material;
   a first select gate coupled to a plurality of the first memory cells of the first array of first memory cells;
   a second array of second memory cells extending in a second direction, opposite to the first direction, from a second surface of the semiconductor material; and
   a second select gate coupled to a plurality of the second memory cells of the second array of second memory cells;
   wherein the first array of first memory cells and the second array of second memory cells each comprise conductively doped regions in the semiconductor material;
   wherein the semiconductor material extends from the first array of first memory cells to the second array of second memory cells; and
   wherein a single source/drain region in the semiconductor material commonly couples both the first and the second select gates to a single data line and extends from the first array of first memory cells to the second array of second memory cells.

2. The memory of claim 1, wherein the first array of first memory cells is selected from a group consisting of a phase-change memory array, a resistive RAM memory array, an array of memory cells configured to be programmed as single-level cells, an array of memory cells configured to be programmed as multi-level cells, and a NAND memory array and the second array of second memory cells is selected from a group consisting of a phase-change memory array, a resistive RAM memory array, an array of memory cells configured to be programmed as single-level cells, an array of memory cells configured to be programmed as multi-level cells, and a NAND memory array.

3. The memory of claim 1, wherein the first array of first memory cells is a non-volatile memory array and the second array of second memory cells is a non-volatile memory array.

4. The memory of claim 1, wherein:
   each of the first memory cells comprises:
      a tunnel dielectric over the first surface of the semiconductor material;
      a charge storage node over the tunnel dielectric;
      an interlayer dielectric over the charge storage node; and
      a control gate over the interlayer dielectric; and
   each of the second memory cells comprises:
      a tunnel dielectric over the second surface of the semiconductor material;
      a charge storage node over the tunnel dielectric;
      an interlayer dielectric over the charge storage node; and
      a control gate over the interlayer dielectric.

5. The memory of claim 1, wherein the conductively doped regions of at least one of the first array of memory cells and the second array of memory cells form other source/drain regions in the semiconductor material.

6. The memory of claim 1, wherein the plurality of the first memory cells of the first array of first memory cells coupled to the first select gate comprises a string of the first memory cells of the first array of first memory cells coupled in series, and wherein the plurality of the second memory cells of the second array of second memory cells coupled to the second select gate comprises a string of the second memory cells of the second array of second memory cells coupled in series.

7. The memory of claim 1, wherein the first select gate extends in the first direction from the first surface of the semiconductor material, and wherein the second select gate extends in the second direction from the second surface of the semiconductor material.

8. A memory, comprising:
   a first array of first memory cells extending in a first direction from a first surface of a semiconductor material; and
   a second array of second memory cells extending in a second direction, opposite to the first direction, from a second surface of the semiconductor material; and
   isolation regions that extend through a charge storage node and a tunnel dielectric of the first array of first memory cells, through the semiconductor material, and through a tunnel dielectric and a charge storage node of the second array of second memory cells;

wherein the first array of first memory cells and the second array of second memory cells each comprise conductively doped regions in the semiconductor material; and wherein the semiconductor material extends from the first array of first memory cells to the second array of second memory cells.

9. The memory of claim 8, wherein the isolation regions terminate on or within interlayer dielectrics of the first array of first memory cells and of the second array of second memory cells.

10. A memory, comprising:

a first array of first memory cells extending in a first direction from a first surface of a semiconductor material; and a second array of second memory cells extending in a second direction, opposite to the first direction, from a second surface of the semiconductor material; and isolation regions that extend through a charge storage node and a tunnel dielectric of the first array of first memory cells, through the semiconductor material, between the conductively doped regions of the second array of second memory cells in the semiconductor material, and through an anti-fuse of the second array of second memory cells;

wherein the first array of first memory cells and the second array of second memory cells each comprise conductively doped regions in the semiconductor material; and wherein the semiconductor material extends from the first array of first memory cells to the second array of second memory cells.

11. The memory of claim 10, wherein:

each of the first memory cells comprises:
 a tunnel dielectric over the first surface of the semiconductor material;
 a charge storage node over the tunnel dielectric;
 an interlayer dielectric over the charge storage node; and
 a control gate over the interlayer dielectric; and each of the second memory cells comprises a portion of the anti-fuse of the second array of second memory cells.

12. The memory of claim 10, wherein the second array of second memory cells is a one-time programmable memory array.

* * * * *